PULSED OSCILLATOR WITH START STOP CONTROLS

Filed Feb. 24, 1961

INVENTOR.
MYRON PLEASURE
BY E. R. Evans
his ATTORNEY 3,265,992

PULSED OSCILLATOR WITH START STOP CONTROLS

Myron Pleasure, Jackson Heights, N.Y., assignor to Litton Systems, Inc., a corporation of Maryland Filed Feb. 24, 1961, Ser. No. 91,540
14 Claims. (Cl. 331—156)

This invention relates to oscillation sources and more particularly it relates to sources of pulsed oscillations.

A principal object of the invention is to provide a novel source of alternating current or pulsating current of constant frequency, which can be keyed off and on with precision.

Another object is to provide an oscillator or constant frequency signal source which can be started instantaneously at full amplitude of oscillation, and which can also be stopped instantaneously.

Another object is to provide a carrier source of constant frequency which can be keyed or pulsed-on at any desired time phase relative to the normal oscillation phase of the source.

A feature of the invention relates to an oscillator having a mechanically resonant element such as a tuning fork, which is provided with associated feed-back coils such as the usual pick-up and drive coils for maintaining the fork in continuous vibration, in conjunction with an electromagnetic control for the fork tines whereby the fork vibration can be started and stopped at any desired instant with precision.

Another feature relates to an oscillator of the tuning fork kind which is capable of use in a wide variety of signaling systems wherein the fork vibration is to be started and stopped with precision with respect to the timing of received starting and stopping pulses. It will be understood, therefore, that while the invention is illustrated in connection with a tuning fork oscillator and its respective controls and in connection with one known kind of signalling or intelligence transmission system, such is done merely for illustrative purposes and not by way of limitation on the invention.

Other features and advantages relate to the novel organization, arrangement and relative location and interconnection of parts which cooperate to provide an improved precision-keyed oscillator of the tuning fork kind. Other features and advantages not specifically enumerated will be apparent after considering the following detailed descriptions and appended claims.

In certain of the arts it is necessary to have a source of constant frequency current or voltage, whether it be of the alternating current or pulstating current kind, which can be keyed on or off at precisely controlled intervals of time by respective starting and stopping pulses. In high speed teleprinter systems of the well known phase modulated kind, for example, wherein the decoding of the mark and space conditions is determined by the phase of the received teleprinter signals with respect to the phase of a local oscillator at the receiving point, it is highly important that the normal phase of the receiving oscillator be accurately maintained over a long period. In such systems, therefore, it has been necessary heretofore to transmit at regularly recurrent intervals between intelligence signal transmissions, a so-called phase checking signal. The purpose of such checking signal is to make sure that the receiving synchronous oscillator is maintained in phase with respect to the distant transmitting oscillator or oscillation signal source. While various forms of electron tube oscillators have been used heretofore for such purposes, I have found that the synchronous phasing oscillations can be generated by a tuning fork oscillator provided that oscillator can be keyed or pulsed off and on, for phase checking purposes, with highly precise timing.

Figure 1:
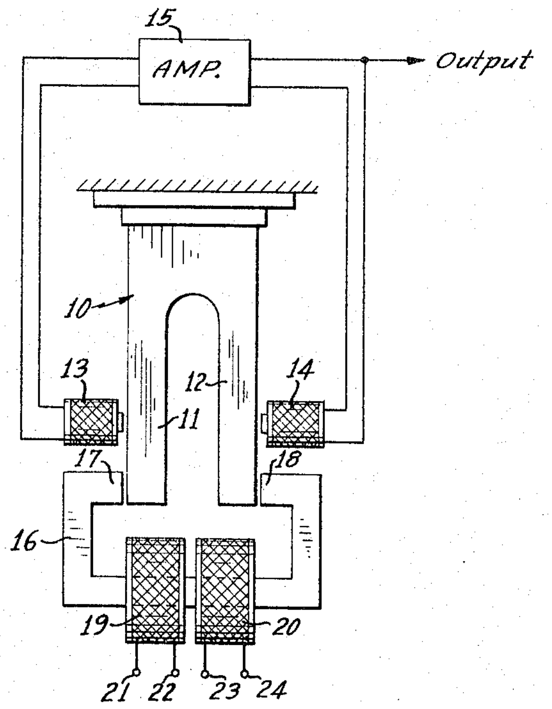
FIG. 1 is a schematic-structural diagram of a tuning fork oscillator embodying the invention.

Such a tuning fork oscillator according to the invention is shown in FIG. 1. The oscillator comprises a tuning fork 10 of any well known construction whose vibratory tines 11, 12 are provided with the usual fork pick-up coil 13 and the usual fork drive coil 14. These coils are interconnected in the proper feed-back relation to maintain the fork in vibration, thus producing at the output a current or voltage of precise frequency. For a detailed description of such a tuning fork oscillator, reference may be had to United States Letters Patent No. 2,469,951 to Austin G. Cooley.

In accordance with the present invention, the fork is provided with an electromagnetic control whereby the fork tines can be positively stopped and locked against vibration even though the pick-up and drive feed-back coils are energized. This electromagnetic control can also be rendered effective to release the fork tines for vibration at any desired time instant. In the particular embodiments shown, the tines are released for vibration at their maximum amplitude of vibration. For that purpose there is provided a soft iron magnetic core 16 having pole pieces 17, 18, located in closely spaced proximity to the outer edge faces of the respective tines 11, 12 but spaced sufficiently therefrom, beyond the normal peak excursion, as shown so that when the tines are vibrating at their normal maximum amplitude, they do not strike the pole pieces 17, 18. In other words, as long as the core 16 is demagnetized the tines are free to vibrate at their constant natural rate.

Core 16 is provided with a pair of coils 19, 20. So long as coil 19 is energized by current of a given polarity at terminals 21, 22, the core 16 is magnetized to attract and capture the tines 11 and 12 so that they are continuously restrained against vibration during the continuance of the said pulse. On the other hand, when coil 19 is deenergized, the core 16 is demagnetized and the fork tines are free to vibrate at their constant frequency under control of the coils 13, 14. In order to insure that the fork tines start vibrating at a precisely timed instant upon the cessation of energization of coil 19, a sharp pulse of the opposite polarity is applied to coil 20. This starting pulse completely demagnetizes the core 16 against any remanent stopping forces on the tines and allows the tines to start vibrating at their maximum amplitude under control of the elements 13, 14 and 15. It is clear, therefore, that by controlling the deenergization of coil 19 and the sharply pulsed reverse energization of coil 20, the phase of vibration of the fork tines can be accurately synchronized with the starting pulse applied to coil 20.

While FIG. 1 shows the fork 10 of a single piece construction, for example of magnetizable material, it will be understood that the fork may be of any other material such as quartz, magnetostrictive material, and the like. In other words, the fork need not be entirely of magnetizable material, provided it carries on its tines magnetizable slugs or strips adjacent the elements 13, 14, 17, 18. Likewise while FIG. 1 shows the fork provided with electromagnetic pick-up and drive elements, such elements may be electrostatic, electromagnetic, magnetostrictive or any combination thereof, such for example as disclosed in U.S. Letters Patent No. 2,979,673 to John R. Shonnard. Preferably, however, the tine clamping is effected by electromagnetic action, such as by the core 16 acting on the tines or on suitable magnetizable slugs or strips attached to the end portions of those tines.

Figure 2:
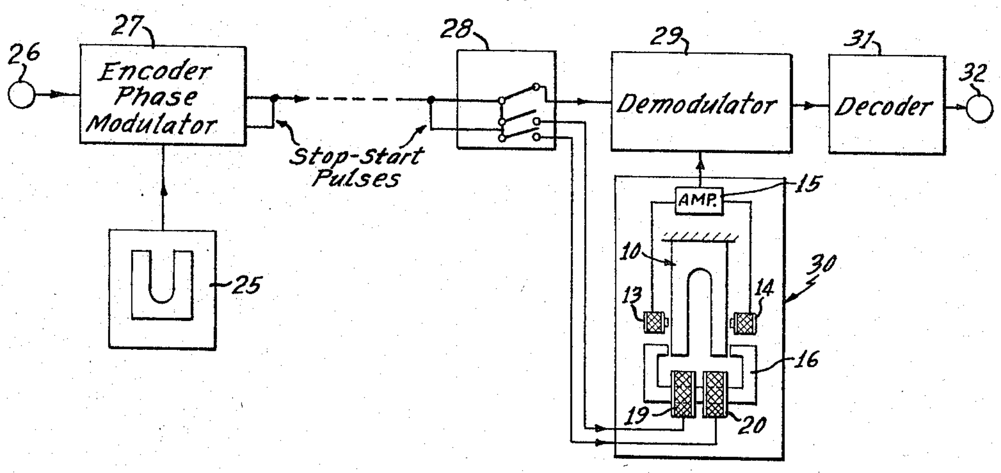
FIG. 2 is a schematic block diagram of a typical transmission system embodying the oscillator of FIG. 1.
Figure 3:
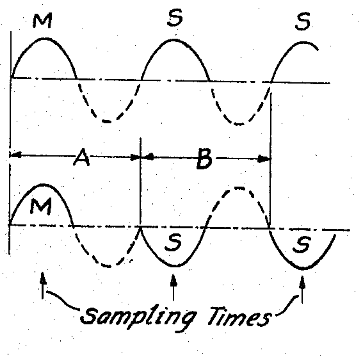
FIG. 3 is a wave diagram explanatory of the invention.

FIG. 2 shows a typical signal transmission system according to the invention. This system may be of any well known data transmission kind wherein the data or intelligence to be transmitted is represented for example by so-called mark and space signal conditions, such as are used in the telegraph signaling art. The transmitter comprises, in general, a source 25 of carrier current for example of 1800 cycles per second, and it may take the form of any well known tuning fork oscillator. The source of intelligence signals may be any well known kind of mark and space telegraph signaling device and is indicated schematically by the numeral 26. The signal source 26 is connected to any well known encoder and phase modulator 27, whereby the phase of the carrier cycles from the source 25 can be shifted or modulated in accordance with the intelligence signals. For example, in the case of mark and space signals, the mark signal condition may be represented by one particular phase of the oscillation cycle from source 25 whereas the space signal condition may be represented by a cycle from the said source of opposite phase. The output of modulator 27 will then consist of cycles of alternating current or pulsating current of a fixed frequency determined by oscillator 25 but with the phase of successive cycles corresponding to either the mark or space signal. For example, for mark signals, the currents from device 27 may be at a normal or unshifted phase, as represented for example by the cycle A (FIG. 3); whereas for a space signal, the current cycle is 180 degrees out of phase, as indicated by the cycle B (FIG. 3).

At regularly recurrent intervals, for example every sixty seconds, there are transmitted from the transmitter by any well known means the stop-start pulses for application to the coils 19, 20 respectively. At the receiving end the phase modulated intelligence signals are applied through a synchronously operating switching device 28 of any well known type operated in synchronism with a corresponding switching mechanism (not shown) at the transmitter. The switch 28, therefore, delivers the modulated intelligence signals to any suitable demodulator 29 and during the start-stop interval the start-stop pulses are applied to the coils 19, 20. As pointed out hereinabove, upon receipt of a stop pulse applied to coil 19, the tuning fork 10 is immediately stopped and remains in its stopped condition until the stop pulse ceases. At that instant the start pulse of reverse polarity is applied to coil 20 to release the fork 10 for vibration. By this means it is possible to start the fork 10 in vibration immediately at its maximum amplitude in response to the starting pulse, the phase of which of course is determined by the phase of the corresponding start pulse device at the transmitter.

Demodulator 29 is fed with local oscillations from the local oscillator 30, which includes the tuning fork oscillator 10 and the associated elements described hereinabove in connection with FIG. 1. It will be understood, of course, that if the carrier source 25 generates a carrier frequency of 1800 c.p.s., then the fork 10 likewise is designed to operate at the same frequency. The demodulator 29 may include or have associated therewith any well known timing or sampling device whereby the received intelligence signals are sampled at regularly recurrent sampling instants at the peak of each of the cycles, as indicated in the lower graph of FIG. 3, or phase detection of any well known kind used to detect the marking and spacing signals. Merely for illustration, FIG. 3 in the lower graph shows a transmitted signal consisting of three signal conditions—mark-space-space. The corresponding oscillations from the oscillator 30 are indicated in the upper graph of FIG. 3. It is clear, therefore, that when the cycles of the oscillations from source 30 and the cycles of the received intelligence waves are in phase, a mark signal condition is produced at the decoder 31, whereas when the cycles of the waves from oscillator 30 are in opposite phase to the phase of the received waves, a space signal is produced at the decoder 31. This relation will be clear from the showing of the respective graphs in FIG. 3. Since the timing or sampling instants occur only at the peaks of alternate half waves, it is only these alternate half waves that are compared in phase to produce the corresponding mark or space signals at the decoder 31. The decoded mark and space signals can then be applied to any well known teleprinter device 32 where they can be reproduced in the well known teleprinter manner.

In such a system the reliability of operation obviously is a function of the drift, if any, of the oscillator 30 with respect to oscillator 25. However, by the above described arrangement for starting and stopping the oscillator 30 precisely at the right phase with respect to the received stop-start signal, any excessive drift in the oscillator 30 is avoided. If the accuracy or frequency stability of the fork oscillators 25 and 30 is for example one part in a million, and the maximum acceptable frequency drift is about a tenth of a cycle, one hundred thousand intelligence bearing cycles could be transmitted between synchronizing or phasing pulses which may occur once every sixty seconds.

It will be clear, of course, that the particular pulse control oscillator 30 has many other useful applications beyond that specifically mentioned and as will be apparent to those familiar with the oscillator keying art.

What is claimed is:

1. A fork oscillator, comprising a tuning fork, fork pick-up means and fork drive means interconnected in mutual feedback relation tending to maintain the fork in continuous vibration, a U-shaped magnetic core having pole faces arranged in closely spaced relation to the ends of the fork tines beyond the normal peak excursion thereof, a vibration stopping coil on said core and a vibration starting coil on said core, means to supply said stopping coil with a stopping pulse of one polarity to attract the ends of the fork tines into contact with said pole pieces and means effective upon the deenergization of said stopping coil to energize said starting coil with a starting pulse of the opposite polarity.

2. A demodulating arrangement for comparing the phase of received signal waves representing intelligence signals with the phase of locally generated waves of the same frequency, said comparison means including a tuning fork oscillator having means to maintain it in continuous vibration at the oscillation frequency, electromagnetic means for controlling the starting and stopping of the fork oscillations, and means to check the phase of the local oscillations with the phase of the oscillations received from a transmitter, the last mentioned means including an electromagnet in magnetic coupled relation with the fork tines, said electromagnet having an energizing winding and means to apply to said winding a stopping pulse for locking the fork against vibration so long as said winding is energized.

3. A demodulating arrangement for comparing the phase of received signal waves representing intelligence signals with the phase of locally generated waves of the same frequency, said comparison means including a tuning fork oscillator having means to maintain it in continuous vibration at the oscillation frequency, electromagnetic means for controlling the starting and stopping of the fork oscillations and means to check the phase of the local oscillations with the phase of the oscillations received from a transmitter, the last mentioned means including an electromagnet in magnetic coupled relation with the fork tines and having a pair of windings thereon, one winding being arranged for energization with one polarity of current to stop the fork vibration and the other winding arranged to be effective upon the deenergization of the first winding and in response to a current of the opposite polarity to thereupon immediately release the fork for continuous vibration at proper phase.

4. A source of oscillations, comprising a vibratory member having a resonant period of vibration, means coupled to said member to generate continuous oscillations under control of the vibration thereof, and electric clamping means for capturing and for instaneously starting the vibration of said member at will at substantially full amplitude.

5. A source of electrical oscillations, comprising a vibratory member having a resonant vibratory period, means coupled to said member to generate electrical oscillations under control of the vibration of said member, and magnetic clamping means for releasing said member from such position as to instantaneously start the vibration of said member to generate immediately oscillations of substantially full amplitude.

6. A source of oscillations of constant frequency, comprising a mechanically resonant device, means to maintain said device normally in continuous oscillation or vibration, and impulse starting means for effecting instantaneous full-amplitude vibration of said device to start the oscillations from said generator at substantially full amplitude, said starting means including an electromagnet having a pole piece closely spaced from the mechanically resonant device in the plane of vibration thereof.

7. In a signal-controlled system for generating oscillations, in combination, a tuning fork, means to maintain said fork normally in continuous vibration, means including a magnetizable core having two pole pieces each in closely spaced relation to one of the tines of the work in the plane of vibration of said tines, and coil means on said core, to instantaneously start and stop the vibration of said fork by alternately releasing and capturing the fork tines against said pole pieces.

8. A signal source comprising a vibratory member having a resonant vibratory period, means coupled to said member to generate oscillations under control of the vibration of said member, and electric clamping means adjacent the vibrating portion of said vibratory member for instantaneously arresting vibration of said member at will.

9. A signal source comprising a vibratory member consisting of a mechanically resonant device having at least part thereof formed of magnetizable material, means coupled to said vibratory member to generate oscillations under control of the vibration of said member, and electric clamping means for instantaneously arresting vibration of said member at will, said clamping means including an electromagnet having a core provided with pole pieces in gapped relation to said magnetizable material and disposed in the plane of vibration of said vibratory member.

10. A signal source comprising a tuning fork, pick-up and driving means to maintain said tuning fork in continuous oscillation, and electric clamping means for instantaneously arresting vibration of said tuning fork at will, said clamping means including electromagnetic means having a magnetizable core in gapped relation to the tines of said tuning fork, to lock said tines against vibration by magnetic attraction.

11. A signal source comprising a vibratory member having a resonant vibratory period and electric clamping means for instantaneously controlling the vibration of said member at will, said clamping means including a core and a pair of magnetizable coils on said core, one coil being arranged for energization of said core by a stopping pulse to restrain said vibratory member against vibration, and means including the second coil for energization of said core in the reverse direction to the energization of said one coil.

12. In the system for generating oscillations, in combination, a fork oscillator comprising a tuning fork and means tending to maintain the fork in continuous vibration, a stationary magnetizable core in closely spaced relation to the fork tines, and energizing means for said core arranged to attract and release at least one of said tines to precisely control the starting of the fork vibrations instantaneously at full amplitude.

13. A source of oscillations comprising a vibratory member having a resonant period of vibration, means coupled to said member to generate continuous oscillations under control of the vibration thereof, and electric clamping means disposed adjacent to the vibratory portion of said vibratory member for instantaneously starting the vibration of said member at will at substantially full amplitude.

14. In a signal controlled system for generating oscillations, in combination, a tuning fork, means to maintain said fork normally in continuous vibration, a magnetizable core having two pole pieces each of said pole pieces extending into closely spaced relation with one of the tines of the fork in the plane of vibration of said tines, and energizing means on said core including opposed coils to instantaneously start and stop the vibration of said fork upon alternate energization of said opposed coils.

References Cited by the Examiner

UNITED STATES PATENTS

| | | | |
|---|---|---|---|
| 2,144,236 | 1/1939 | Whitaker ---------- | 331—156 |
| 2,168,623 | 8/1939 | Miessner ----------- | 84—1.13 |
| 2,691,749 | 10/1954 | Durkee ------------- | 310—25 |
| 2,735,984 | 2/1956 | Shepherd ----------- | 332—51 |
| 2,817,779 | 12/1957 | Baranaby et al. ------ | 310—25 |

ROY LAKE, *Primary Examiner.*

K. CLAFFY, C. L. JUSTUS, J. KOMINSKI, R. A. FARLEY, *Assistant Examiners.*